United States Patent
Lai et al.

(10) Patent No.: US 10,103,024 B2
(45) Date of Patent: Oct. 16, 2018

(54) PHASE CHANGE MEMORY WITH DIODES EMBEDDED IN SUBSTRATE

(71) Applicant: Taiwan Semiconductor Manufacturing Company, Ltd., Hsin-Chu (TW)

(72) Inventors: Fang-Shi Jordan Lai, Chia Yi (TW); ChiaHua Ho, Guanxi Town (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/056,268

(22) Filed: Feb. 29, 2016

(65) Prior Publication Data

US 2016/0181106 A1 Jun. 23, 2016

Related U.S. Application Data

(63) Continuation of application No. 12/969,342, filed on Dec. 15, 2010, now Pat. No. 9,276,209, which is a continuation of application No. 11/932,574, filed on Oct. 31, 2007.

(51) Int. Cl.
    *H01L 21/265* (2006.01)
    *H01L 27/24* (2006.01)
    *H01L 45/00* (2006.01)
    *H01L 21/762* (2006.01)
    *H01L 29/861* (2006.01)

(52) U.S. Cl.
    CPC .. *H01L 21/26513* (2013.01); *H01L 21/76224* (2013.01); *H01L 27/2409* (2013.01); *H01L 27/2463* (2013.01); *H01L 29/861* (2013.01); *H01L 45/06* (2013.01); *H01L 45/126* (2013.01); *H01L 45/1233* (2013.01); *H01L 45/144* (2013.01)

(58) Field of Classification Search
    CPC ............. H01L 21/76229; H01L 21/425; H01L 27/2463; H01L 27/2409
    See application file for complete search history.

(56) References Cited

U.S. PATENT DOCUMENTS

| | | |
|---|---|---|
| 6,437,383 B1 | 8/2002 | Xu |
| 6,579,760 B1 | 6/2003 | Lung |
| 6,740,921 B2 | 5/2004 | Matsuoka et al. |
| 7,157,732 B2 | 1/2007 | Krieger et al. |
| 7,384,854 B2 | 6/2008 | Voldman |
| 7,541,252 B2 | 6/2009 | Eun et al. |

(Continued)

OTHER PUBLICATIONS

Oh, J.H., et al., "Full Integration of Highly Manufacturable 512Mb PRAM based on 90nm Technology," International Electron Devices Meeting, Dec. 11-13, 2006, 4 pages, IEEE.

*Primary Examiner* — Laura Menz
*Assistant Examiner* — Candice Y Chan
(74) *Attorney, Agent, or Firm* — Slater Matsil, LLP

(57) ABSTRACT

An integrated circuit structure includes a semiconductor substrate; a diode; and a phase change element over and electrically connected to the diode. The diode includes a first doped semiconductor region of a first conductivity type, wherein the first doped semiconductor region is embedded in the semiconductor substrate; and a second doped semiconductor region over and adjoining the first doped semiconductor region, wherein the second doped semiconductor region is of a second conductivity type opposite the first conductivity type.

20 Claims, 11 Drawing Sheets

(56) References Cited

U.S. PATENT DOCUMENTS

| | | |
|---|---|---|
| 8,039,372 B2 | 10/2011 | Min et al. |
| 2002/0093100 A1 | 7/2002 | Gonzalez et al. |
| 2002/0177292 A1 | 11/2002 | Dennison |

# PHASE CHANGE MEMORY WITH DIODES EMBEDDED IN SUBSTRATE

PRIORITY CLAIM AND CROSS-REFERENCE

This application is a continuation of U.S. patent application Ser. No. 12/969,342, entitled "Phase Change Memory with Diodes Embedded in Substrate," filed Dec. 15, 2010 which application is a continuation of Ser. No. 11/932,574, filed Oct. 31, 2007, and entitled "Phase Change Memory with Diodes Embedded in Substrate," which applications are hereby incorporated by reference.

TECHNICAL FIELD

This invention relates generally to semiconductor devices, and more particularly to memory cells, and even more particularly to phase change memories including diodes as selectors and methods for manufacturing the same.

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1,000, and thus the resulting memory devices are unlikely to have errors for reading states. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PRAM).

FIG. 1 illustrates a circuit diagram of a conventional phase change memory array, which includes address lines extending in X and Y directions. Each of the memory cells 2 is electrically coupled between one of the address lines extending in the X direction and one of the address lines extending in the Y direction. Memory elements 4 in memory cells 2 are formed of phase change materials. To reduce the disturbance between memory cells, memory cells 2 typically include selectors 6, which may be formed of bipolar transistors, MOS devices, p-n junctions, and the like.

FIG. 2 illustrates a perspective view of a portion of a memory array, which implements the phase change memory array shown in FIG. 1. In this structure, the selectors 6 are formed of p-n diodes, each including a p-type polysilicon layer 8 and an n-type polysilicon layer 10. Phase change elements 4 are stacked on the p-n diodes 6. The p-n diodes 6 are serially connected to a phase change elements 4. Perpendicular address lines are formed overlying and underlying, and are connected to, the memory cells 2. A drawback of the structure shown in FIG. 2 is that the stacked memory cells include several layers, and thus after the step of patterning the memory cell stacks, but before filling the space between the memory cell stacks, the memory cell stacks are prone to collapse.

FIG. 3 illustrates a cross-sectional view of another conventional phase change memory, wherein the cross-sectional view is taken along the word-line direction. The phase change memory includes an N+ word-line 14 formed at the top portion of substrate 12, wherein the N+ word-line 14 is formed by heavily doping the top surface of substrate 12. Memory cells 16 are formed over, and electrically connected to, word-line 14. Each memory cell 16 includes diode selector 21 formed of n-type region 18 and p-type region 20. Bottom electrodes 26, phase change elements 28, and top electrodes 30 are formed over the diode selector 21. Metal lines in the first metallization layer (M1) act as bit-lines. Word-line 14 is further connected to pickup contact 36. Regions 18, 20, 26, and 28 are formed in an inter-layer dielectric (ILD) 22, which may include several sub layers.

The memory array shown in FIG. 3 suffers from drawbacks. First, pickup contact 36 and the underlying word-line 14 form a Schottky contact instead of an Ohm contact, and voltage drop at the Schottky contact results in a higher voltage requirement to the power supply. Second, diodes 21 are formed by forming an opening in ILD 22; performing a silicon ion implantation to form a silicon layer in the opening; and then growing silicon in the opening using solid phase epitaxy. Disadvantageously, this process is performed after the formation of peripheral MOS devices, and hence causing a dilemma, that is, a low epitaxy temperature will reduce the growth rate, and hence reducing the manufacturing throughput. On the other hand, a high epitaxy temperature will increase the thermal budget of the already formed peripheral MOS devices, adversely affecting their performance. Third, the silicon ion implantation requires a high dosage and a high energy, which will also adversely affect the performance of the peripheral MOS devices. New memory cells free from the above-discussed problems are thus needed.

SUMMARY OF THE INVENTION

In accordance with one aspect of the present invention, an integrated circuit structure includes a semiconductor substrate; a diode; and a phase change element over and electrically connected to the diode. The diode includes a first doped semiconductor region of a first conductivity type, wherein the first doped semiconductor region is embedded in the semiconductor substrate; and a second doped semiconductor region over and adjoining the first doped semiconductor region, wherein the second doped semiconductor region is of a second conductivity type opposite the first conductivity type.

In accordance with another aspect of the present invention, an integrated circuit structure includes a semiconductor substrate; a diode array comprising a plurality of diodes embedded in the semiconductor substrate and arranged as rows and columns. Each of the plurality of diodes includes a first doped semiconductor region of a first conductivity type; and a second doped semiconductor region over, and adjoining, the first doped semiconductor region, wherein the second doped semiconductor region is of a second conductivity type opposite the first conductivity type. The integrated circuit structure further includes a plurality of heavily doped semiconductor strips of the first conductivity type, each underlying and connected to a row of the diodes and adjoining the first doped semiconductor region of the row of the diodes.

In accordance with yet another aspect of the present invention, an integrated circuit structure includes a semiconductor substrate; a plurality of word-lines embedded in the semiconductor substrate; a diode array comprising a plurality of diodes arranged as rows and columns, wherein the plurality of diodes are embedded in the semiconductor substrate and overlying the plurality of word-lines; a plurality of insulating regions in the semiconductor substrate and separating the rows of the plurality of the diodes from each other; a plurality of shallow insulating regions in the semiconductor substrate and separating the columns of the plurality of the diodes from each other, wherein the plurality of shallow insulating regions has a thickness less than a thickness of the plurality of insulating regions; and a plurality of phase change elements, each overlying, and electrically connected to, one of the plurality of diodes.

In accordance with yet another aspect of the present invention, a method for forming an integrated circuit structure includes providing a semiconductor substrate; and forming a diode, which includes forming a first doped semiconductor region of a first conductivity type, wherein the first doped semiconductor region is embedded in the semiconductor substrate; and forming a second doped semiconductor region over and adjoining the first semiconductor region, wherein the second doped semiconductor region is of a second conductivity type opposite the first conductivity type. The method further includes forming a phase change element over and electrically connected to the diode.

In accordance with yet another aspect of the present invention, a method for forming an integrated circuit structure includes providing a semiconductor substrate; forming a first insulating region in the semiconductor substrate; implanting the semiconductor substrate to form an embedded word-line; implanting the semiconductor substrate to form a first part of a diode overlying, and adjoining, the embedded word-line, wherein the first part of the diode adjoins an edge of the first insulating region; forming a second insulating region in the semiconductor substrate and adjoining the diode, wherein the second insulating region is perpendicular to the first insulating layer, and wherein the second insulating region is shallower than the first insulating layer; implanting the semiconductor substrate to form a second part of the diode overlying and adjoining the first part, wherein the first and the second parts are of opposite conductivity types; and forming a phase change element over, and electrically connected to, the diode.

The advantageous features of the present invention include reduced degradation to MOS device on the same chip due to the fact that the diodes are formed of implantation instead of epitaxial growth, and reduced voltage drop due to the formation of silicides for pickup regions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel phase change memory and the methods of forming the same are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 1:
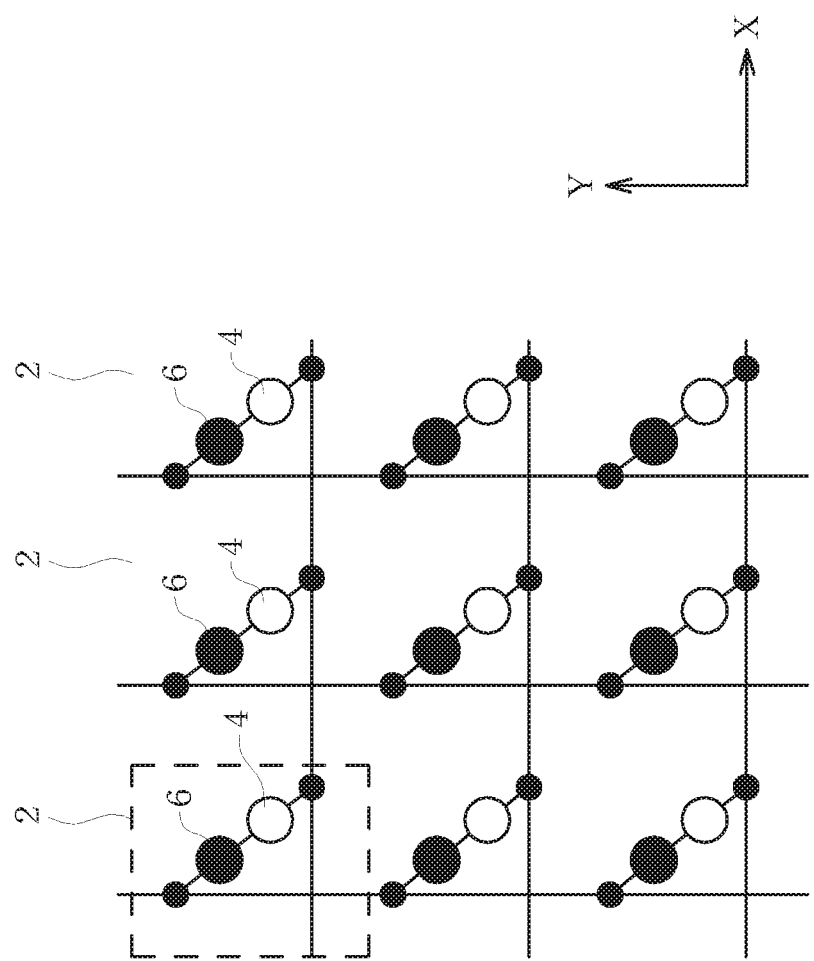
FIG. 1 illustrates a circuit diagram of a conventional phase change memory array.
Figure 2:
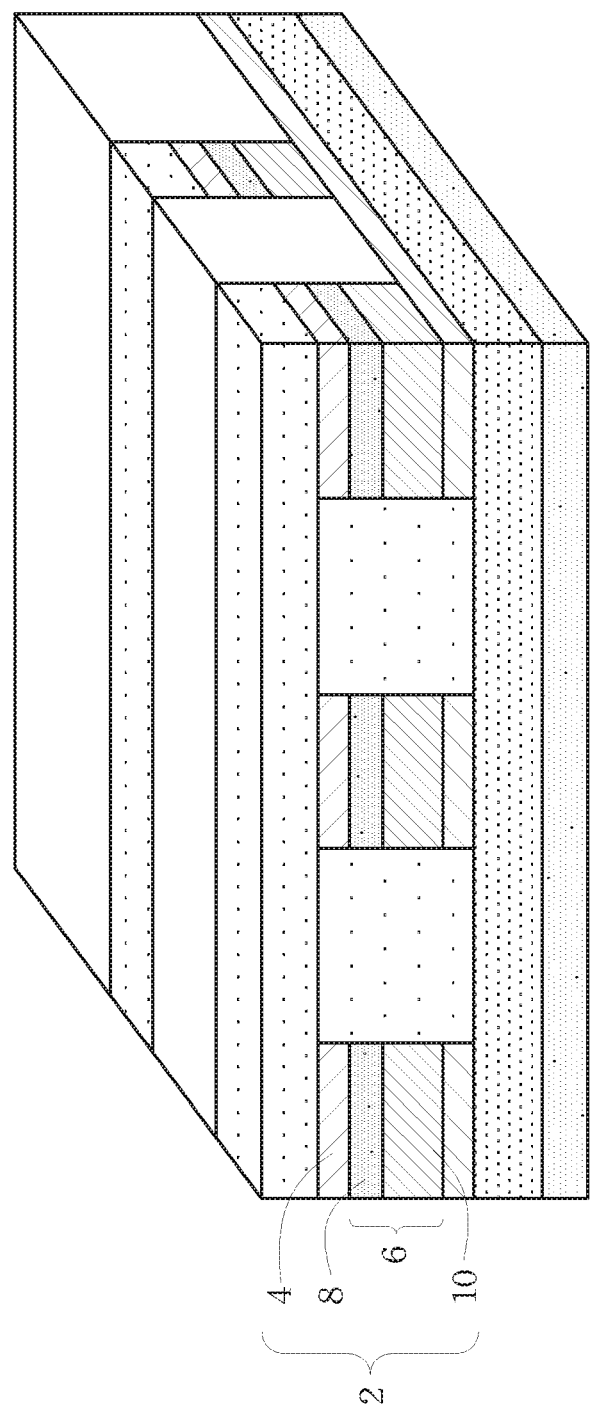
FIG. 2 illustrates a cross-sectional view of a phase change memory array, which includes diodes as selectors.
Figure 3:
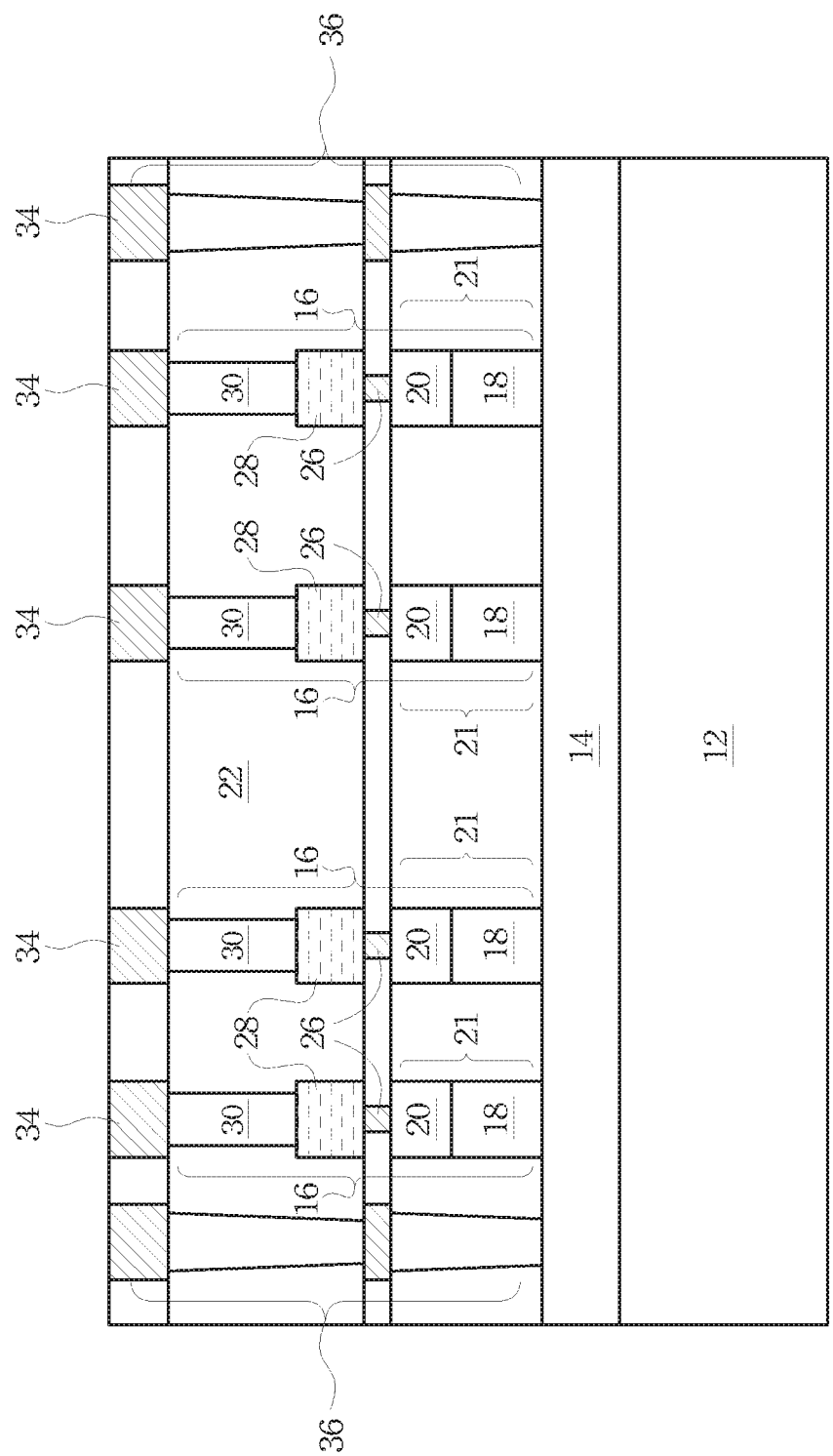
FIG. 3 illustrates a cross-sectional view of a phase change memory array, wherein diodes are formed over a semiconductor substrate.
Figure 4:
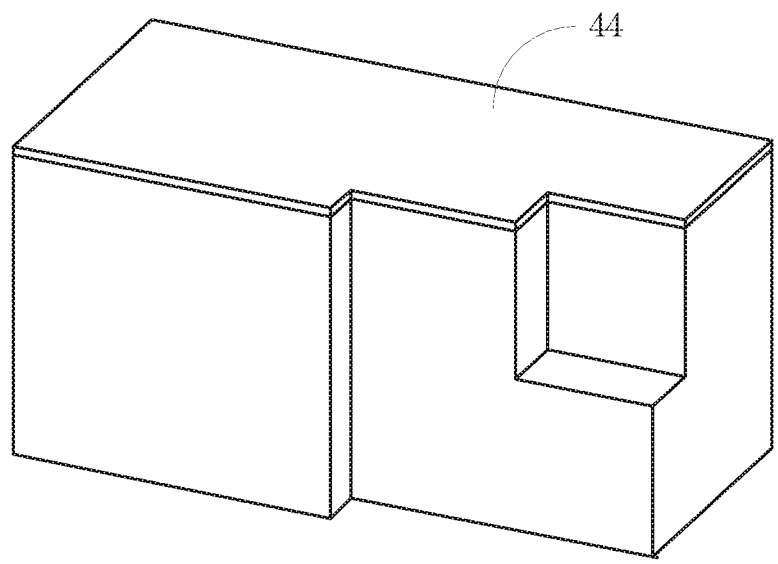
FIGS. 4 through 16 are cross-sectional views of intermediate stages in the manufacturing of an embodiment of the present invention, wherein diodes are formed in a semiconductor substrate.

FIGS. 4 through 7 illustrate the formation of STI regions 42 in substrate 40. Referring to FIG. 4, substrate 40 is provided. In an embodiment, substrate 40 is a bulk silicon substrate. In other embodiments, substrate 40 may be formed of other semiconductor materials including group III, group IV, and group V elements. Substrate 40 is preferably lightly doped with a p-type impurity, although it may also be of n-type. In yet other embodiments, substrate 40 has a silicon-on-insulator structure. Pad layer 44 is formed over substrate 40. Pad layer 44 is preferably a thin oxide film formed through a thermal process, and may be used for reducing the stress between substrate 40 and the subsequently formed hard mask 46.

Figure 5:
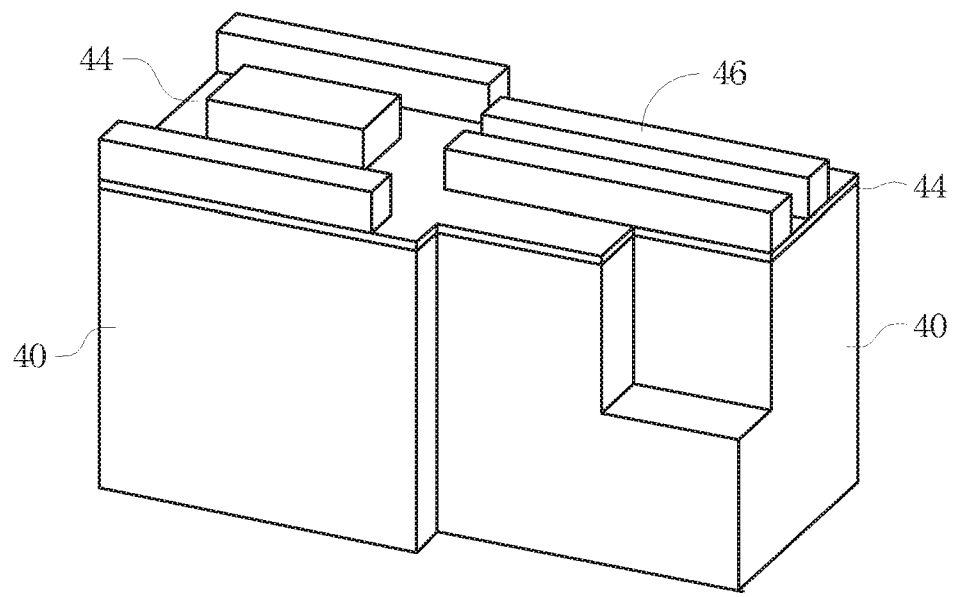

Referring to FIG. 5, hard mask 46 is formed and patterned. In the preferred embodiment, hard mask 46 is formed of silicon nitride using low-pressure chemical vapor deposition (LPCVD). In other embodiments, hard mask 46 is formed of high-density plasma (HDP) nitride or plasma enhanced CVD silicon nitride. In yet other embodiments, hard mask 46 is formed by thermal nitridation or plasma anodic nitridation of silicon using nitrogen.

Figure 6:
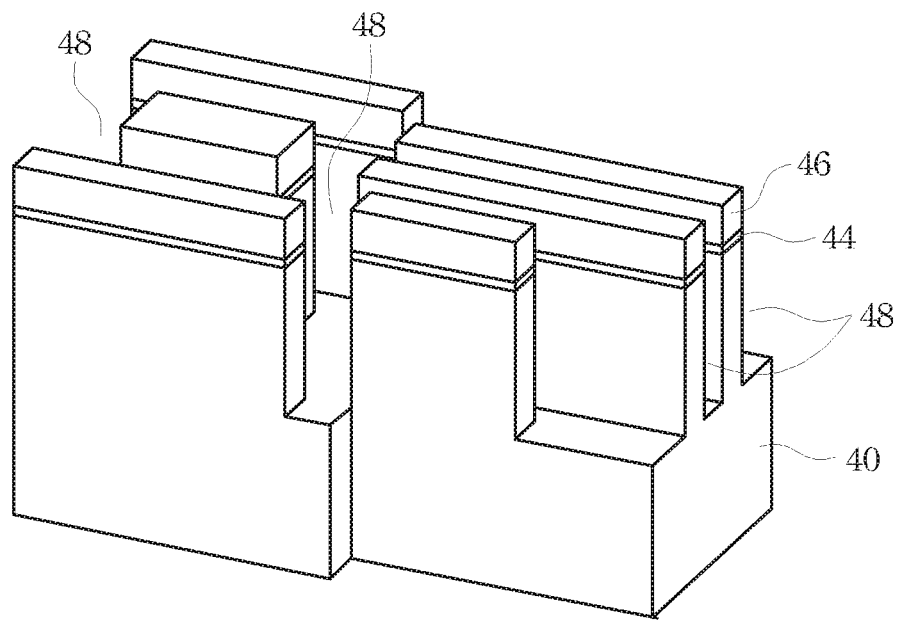

FIG. 6 illustrates the patterning of pad layer 44 and the formation of openings 48 in substrate 40, for example, by anisotropic plasma etching using fluorine-containing chemicals. Openings 48 define active regions for forming metal-oxide-semiconductor (MOS) devices and phase change memory arrays.

Figure 7:
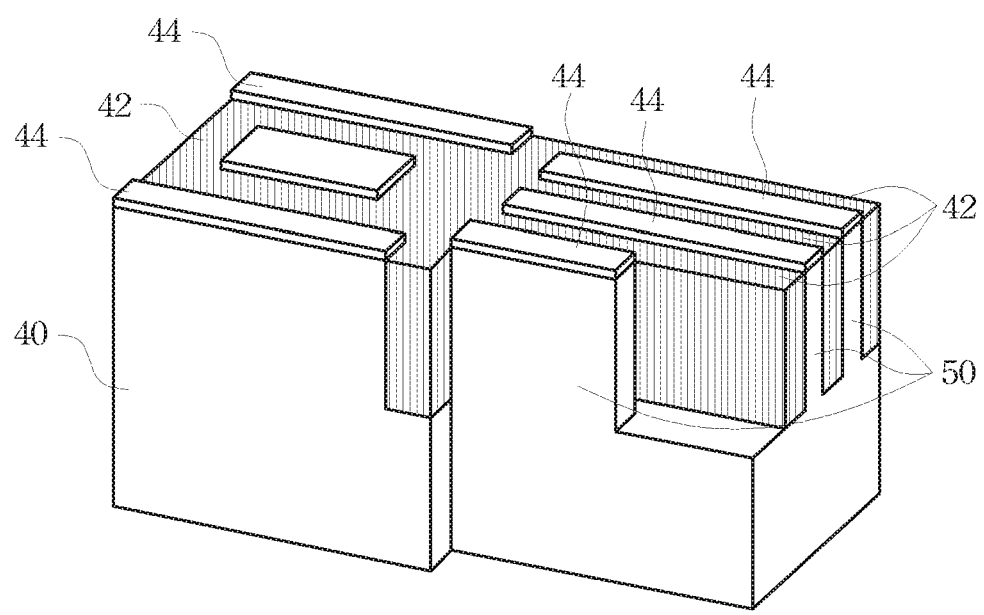

Referring to FIG. 7, dielectric materials are filled into openings 48, followed by a chemical mechanical polish (CMP) to remove excess dielectric material, leaving shallow trench isolation (STI) regions 42 in openings 48. Hard mask 46 is used as a CMP stop layer. Preferably, the dielectric materials include a liner oxide and an additional oxide formed of high-density plasma deposition processes such as high-density plasma CVD (HDP oxide). Hard mask 46 is then removed, for example, using a $H_3PO_4$ solution. As a result, a plurality of parallel active regions (strips) 50 is formed. Throughout the description, the length-wise direction of active regions 50 is referred to the row direction, and the direction perpendicular to the row direction is referred to as the column direction. One skilled in the art will realize, however, that the concepts of the row and the column are interchangeable. Please note that one of the active regions 50 is shown as shorter than others. This is for the purpose of a clearer view of the internal structures. In reality, all active regions 50 preferably have the same length.

Figure 8:
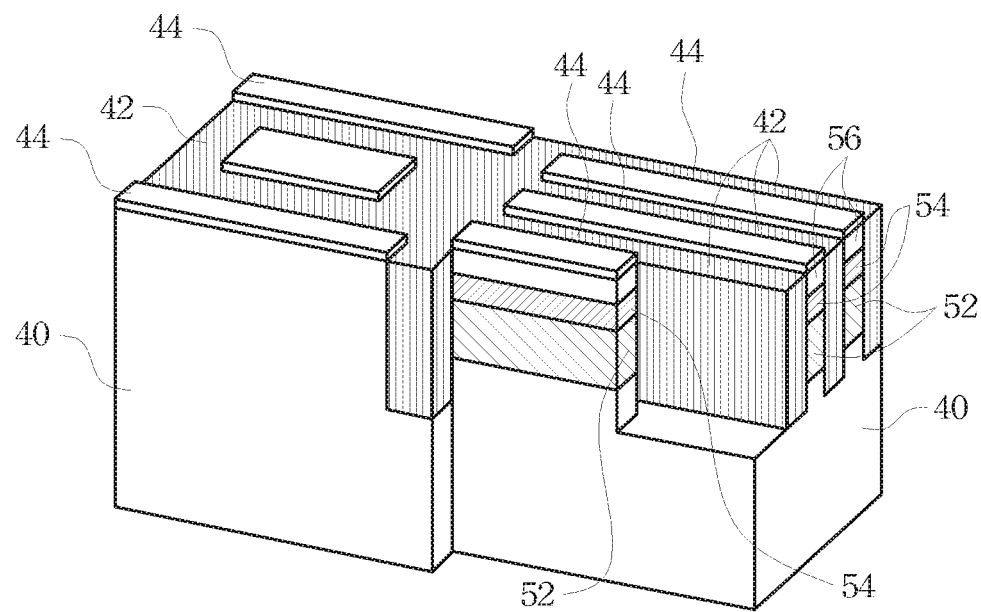

FIG. 8 illustrates the formation of heavily doped n-type (N+) strips 52 and moderately doped n-typed strips 54 (referred to N strips 54 hereinafter), preferably by implanting n-type impurities, such as arsenic. In an exemplary embodiment, the term "heavily doped" refers to an impurity concentration of between about $10^{19}/cm^3$ and about $10^{20}/cm^3$, while the term "moderately doped" refers to an impurity concentration of between about $10^{17}/cm^3$ and about $10^{18}/cm^3$. It is noted that the terms "heavily doped" and "moderately doped" are terms of art, and are related to technology generations, impurities, and the like. In a first embodiment, two n-type impurity implantations are performed. One of the implantations uses a higher energy and a higher dose, so that N+ strips 52 are formed deep in substrate 40. The other implantation uses a lower energy and a lower dose to form N strips 54. In an exemplary embodiment, the higher energy is between about 40 keV and about 60 keV, while the lower energy is between about 10 keV and about 30 keV. In alternative embodiments, only one implantation is performed, so that N+ strips 52 are formed around where most of the impurities concentrate, while N strips 54 are formed by diffusions as the result of subsequent anneals. In practical cases, N strips (not shown) will also be formed underlying N+ regions 52. As a result of the n-type impurity implantations, a p-type layer 56 may be left over N strips 54. It is also possible that N strips 54 extend all the way to the top surface of substrate 40.

Figure 9:
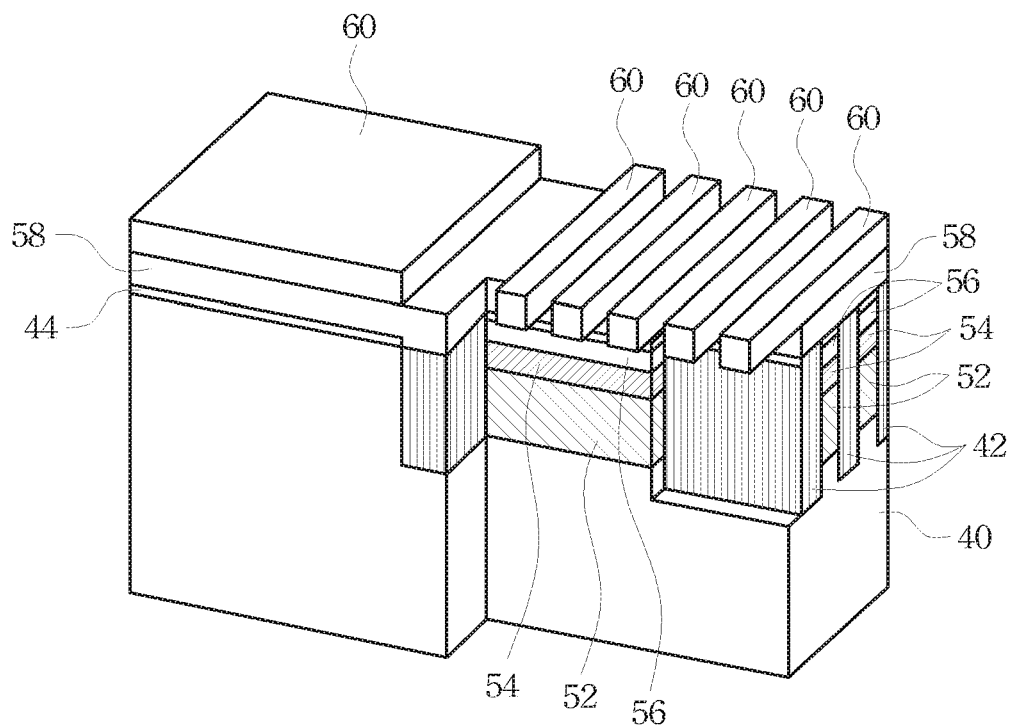

In FIG. 9, hard mask 58 is formed, followed by the application and patterning of photo resist 60. Preferably, patterned photo resist 60 forms strips perpendicular to N+ strips 52. Hard mask 58 and pad layer 44 are then patterned, exposing underlying p-type layer 56. Photo resist 60 is striped. Next, using hard mask 58 and pad layer 44 as masks, an anisotropic etching is performed to etch exposed p-type layer 56 and top portions of N strips 54. Preferably, the etchant is selected with a high etching selectivity to ensure that during the patterning of hard mask 58 and pad layer 44 and the etching of p-type layer 56 and N strips 54, STI regions 42 are not damaged. In an exemplary embodiment, HBr and oxygen are used as etchants for etching p-type layer 56 and N strips 54.

Figure 10:
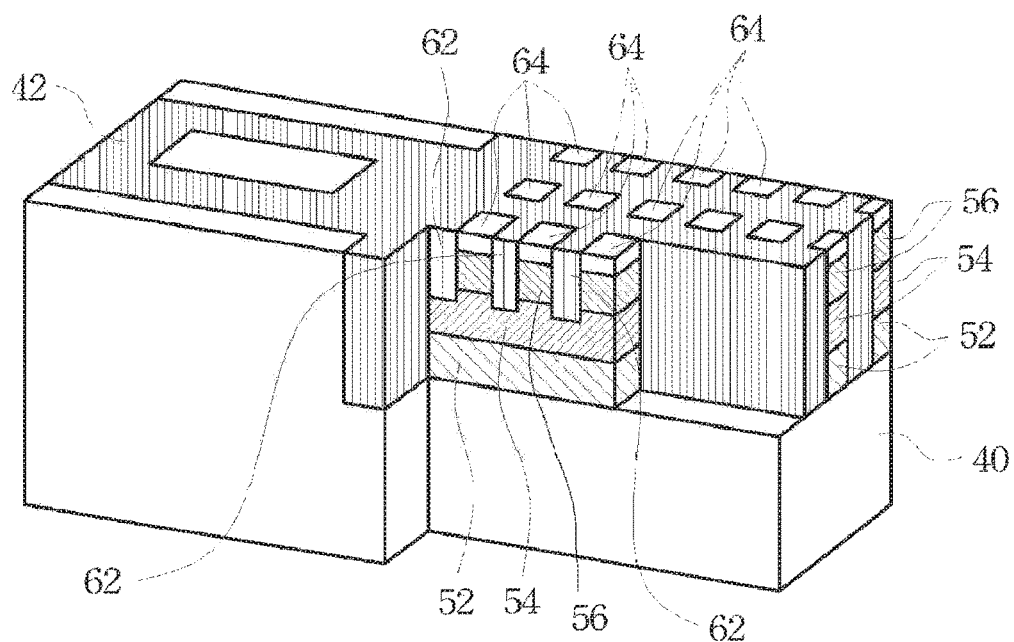

The resulting openings are then filled, forming shallow STI (SSTI) regions 62, as shown in FIG. 10. Hard mask 58 and pad layer 44 are then removed, wherein pad layer 44 may be removed using diluted HF. SSTI regions 62 may include essentially the same materials, and formed using essentially the same methods, as STI regions 42. The preferred depth of SSTI regions 62 is discussed in subsequent paragraphs. Optionally, an annealing is performed to release dislocations in remaining semiconductor regions 52, 54 and 56. In an exemplary embodiment, a liner oxide in SSTI regions 62 is formed using furnace oxidation at, for example, about 1050° C. for about 30 minutes. Also, an annealing is performed to the liner oxide at about 1050° C. for about 30 minutes. STI regions 42 and SSTI regions 62 in combination isolate semiconductor islands, which are arranged as an array. The exposed remaining portions of p-type layer 56 are indicated as p-type regions 64.

Figure 11:
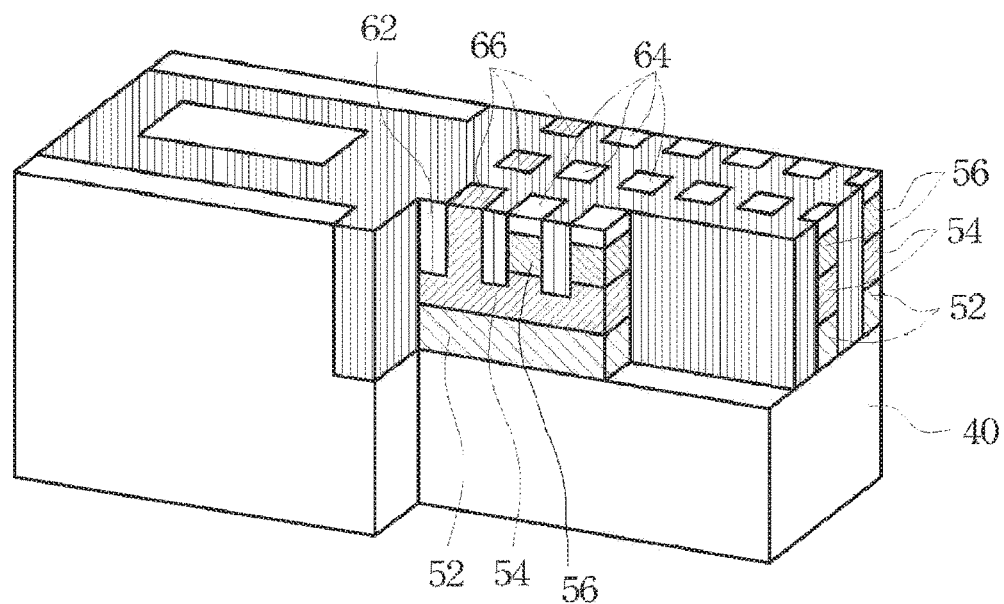

In FIG. 11, pickup regions 66 are formed by implanting a column of exposed p-type regions 64 with an n-type impurity, such as arsenic, to a high impurity concentration. Pickup regions are thus N+ regions. During the implantation, a photo resist or mask (not shown) needs to be formed to cover the remaining regions except the column. The implanted n-type impurity preferably extends to N+ strips 52, so that pickup regions 66 are connected to N+ strips 52 through all low-resistive paths.

Figure 12:
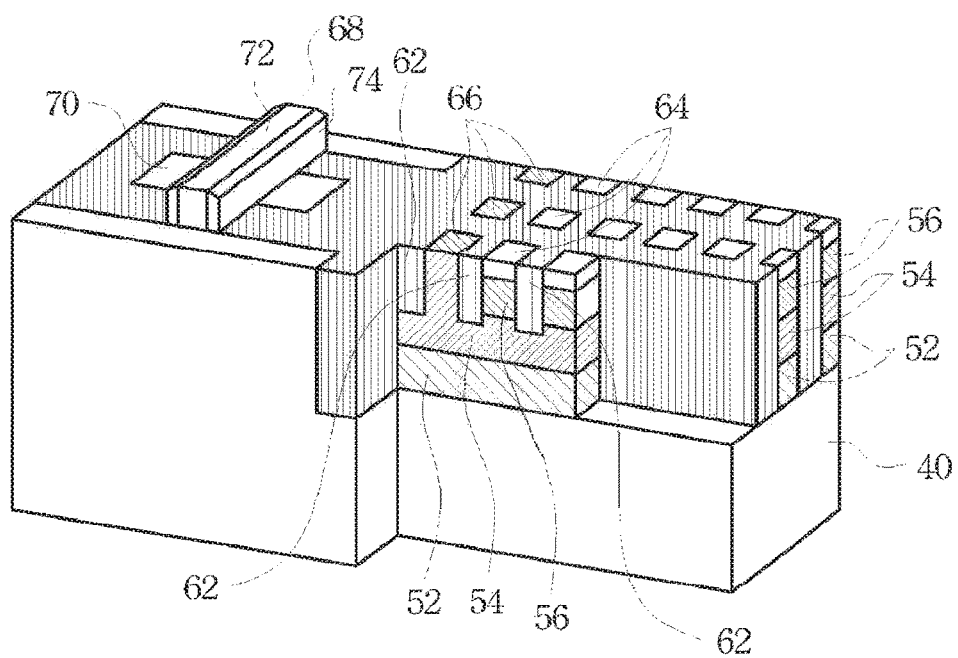
Figure 13:
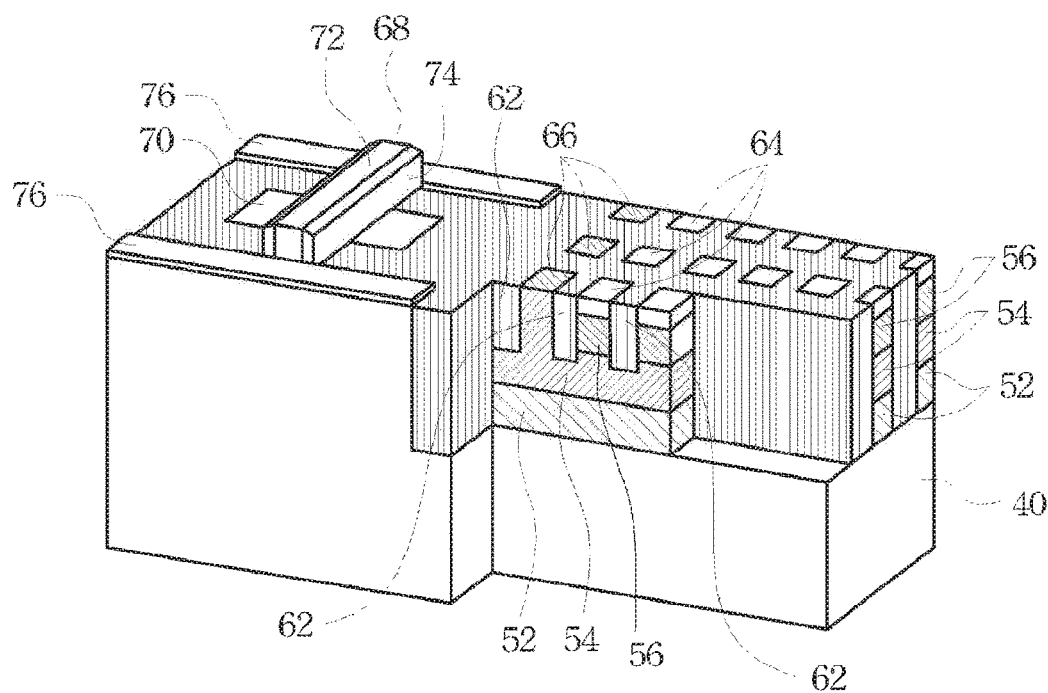

FIG. 12 illustrates the formation of a MOS device 68, which may be a peripheral device. MOS device 68 includes source/drain regions 70, gate 72, and gate spacers 74. The formation of MOS device 68 is well known in the art, and thus is not repeated herein. In FIG. 13, resist protective oxide layer 76 is formed to cover portions of silicon that do not need to be silicided.

Figure 14:
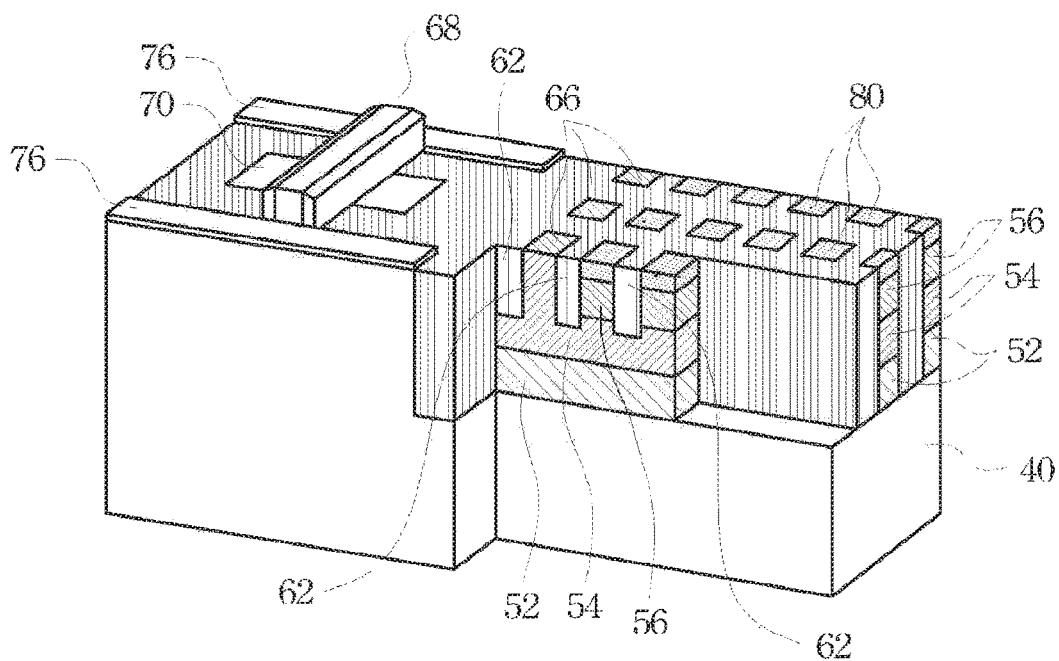

Next, as shown in FIG. 14, a p-type impurity (such as boron) implantation is performed to implant exposed p-type regions 64, wherein pickup regions 66 are covered. Preferably, the implantation is performed using a low energy, for example, about 5 keV, and a dosage of about 1.5 E15/cm$^2$. Advantageously, since the high thermal budget processes for forming MOS devices have been finished, the profile of p-type impurities (preferably including boron) is substantially fixed. On the other hand, since arsenic has a low diffusing ability, N+ strips 52 and N regions 54 are preferably formed before the formation of MOS device 68, although they can also be formed after MOS device 68 is formed. The implantation causes the increase in the p-type impurity concentration in regions 64. The resulting P+ regions are referred to as P+ regions 80.

Figure 15A:
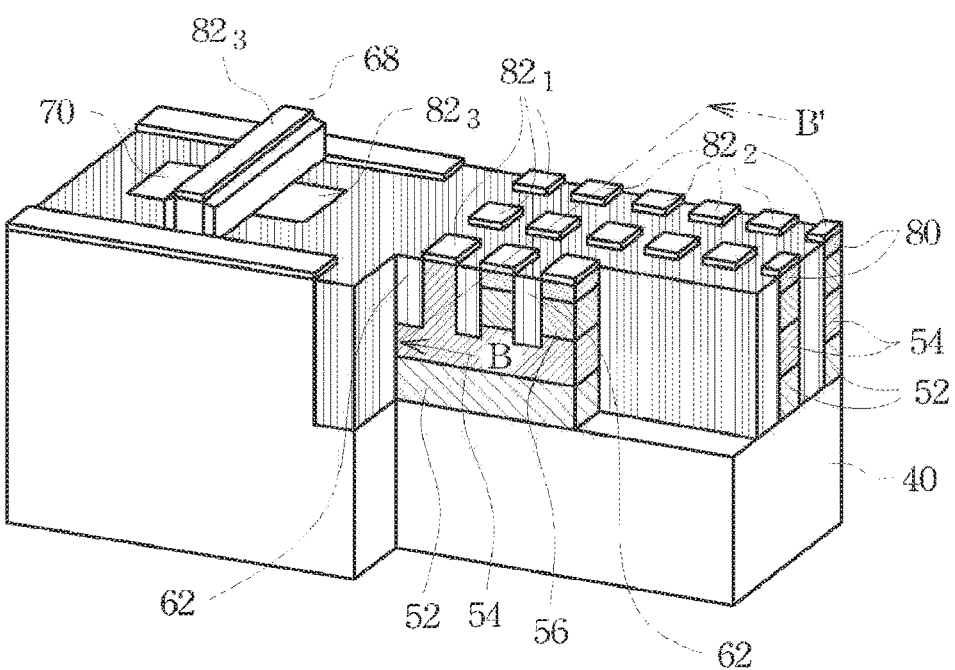
Figure 15B:
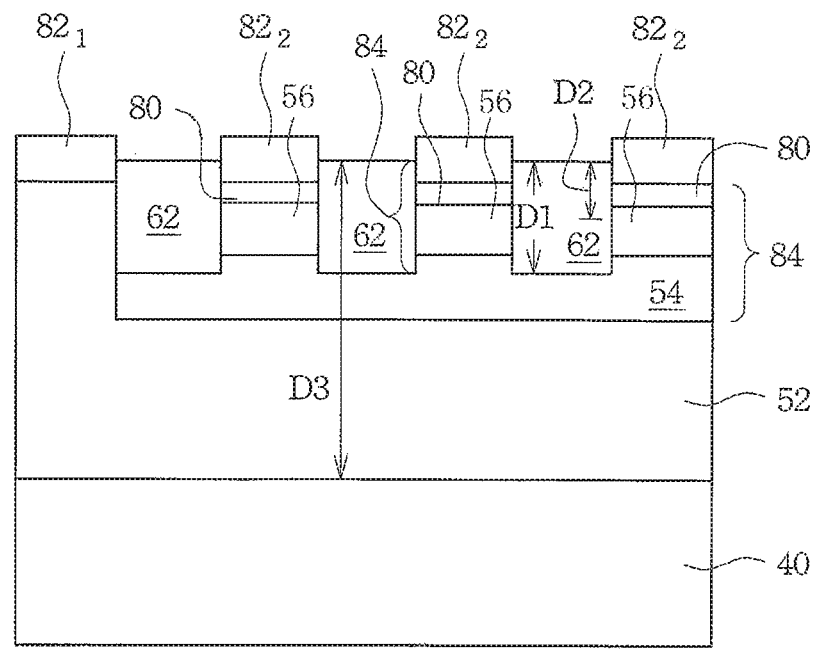
Figure 15C:
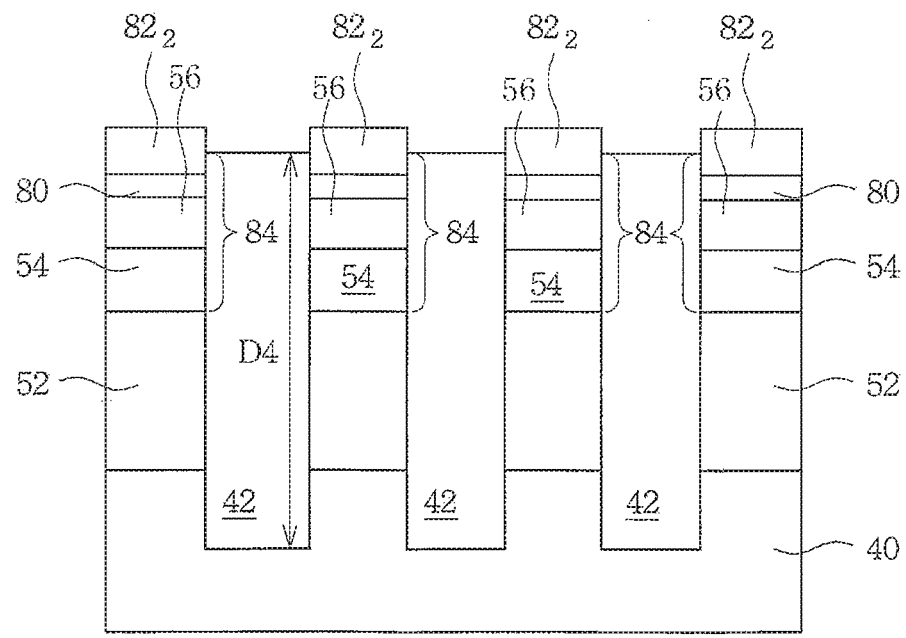

Next, as shown in FIG. 15A, silicide regions 82 are formed, which may include nickel silicide, cobalt silicide, and/or other commonly adopted metal silicides. Silicide regions 82 include portions $82_1$ on pickup regions 66, portions $82_2$ on P+ regions 80, and silicide regions $82_3$ on MOS device 68. FIGS. 15B and 15C indicate cross-sectional views of the structure shown in FIG. 15A, wherein the cross-sectional views are taken along planes crossing lines A-A' and B-B', respectively. FIGS. 15A, 15B, and 15C show that STI regions 42 and SSTI regions 62 separate active regions into array cells, wherein each of the array cells includes a diode 84 formed of n-type strip 54 and one of p+ regions 80. Therefore, the depth D1 of SSTI region 62 needs to be greater than the junction depth D2, or alternatively, the depth D1 of SSTI region 62 is smaller than the junction depth as shown in FIG. 14. SSTI region 62 may also extend into a portion of N+ strips 52. However, this may cause the adverse increase in the resistance of word-lines 52.

In an exemplary embodiment, junction depth D2 is about 700 Å. The depth D3 of the junction between N+ strips 52 and substrate 40 is about 2200 Å. Accordingly, if depth D1 of SSTI regions 62 is about 900 Å, and depth D4 of STI regions 42 is about 3000 Å, diodes 84 can be effectively isolated.

Figure 16:
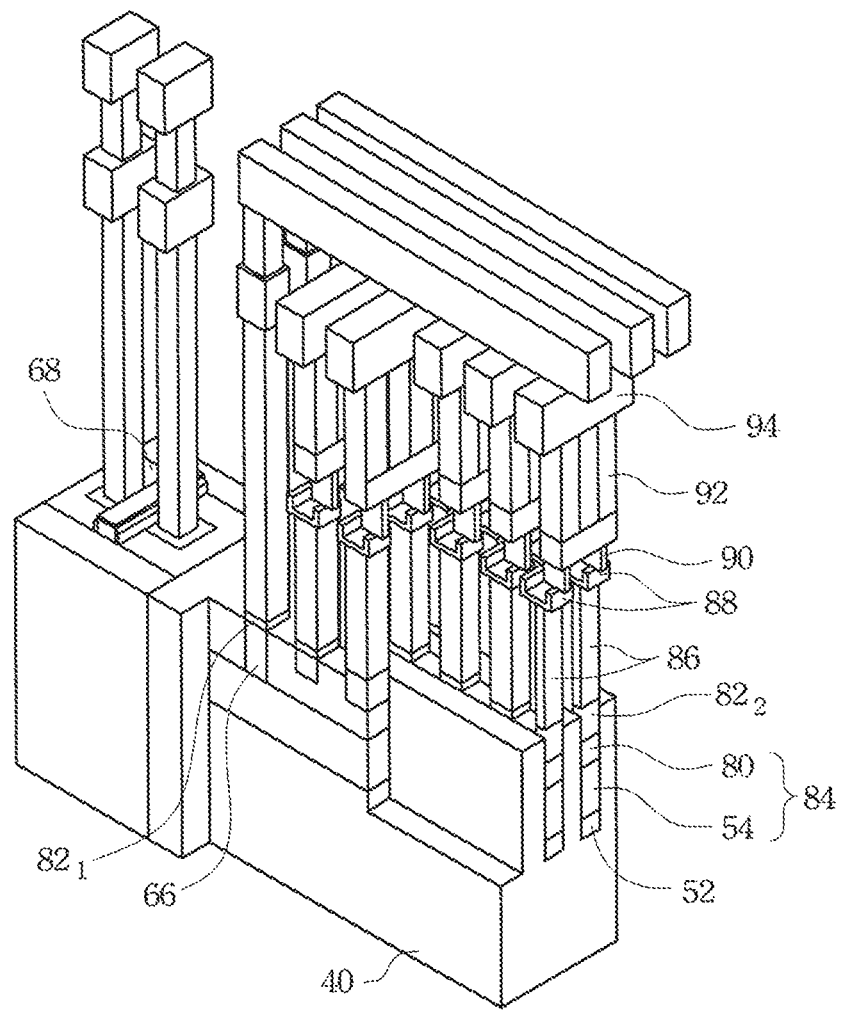

Diodes 84 shown in FIGS. 15A, 15B, and 15C may be used as selectors of a phase change memory array, which is shown in FIG. 16. The formation of the phase change elements is briefly discussed as follows. For a clear view, dielectric materials are not shown. First, bottom electrode contacts (BEC) 86, which may include essentially the same materials (such as tungsten), and using essentially the same methods as contact plugs, are formed. Heaters 88 are then formed over and electrically connected to BECs 86. The formation of heaters 88 may include forming a dielectric layer over BECs 86; forming openings in the dielectric layer to expose BECs 86; blanket forming a thin heater layer in the openings; forming a dielectric layer filling the remaining portions of the openings; and performing a CMP to remove portions of the heater layer over the top surface of the dielectric layer. In the resulting structure, the top edges of heaters 88 form a ring, although they may appear as shown in FIG. 16 if formed of different processes. Heaters 88 are preferably formed of materials selected from TiN, TaN, TiSiN, TiAlN, TiCN, and combinations thereof, or other conductive materials.

Phase change elements 90 are then formed over, and in contact with, the edges of heaters 88. Phase change elements 90 include phase change materials capable of having phase changes. In the preferred embodiment, phase change elements 90 are formed of GeSbTe. In other embodiments, phase change elements 90 comprise other commonly used chalcogenide materials including one or more of Ge, Te, and Sb, e.g., or stoichiometric materials. In an embodiment, phase change elements 90 each has a top portion and a bottom portion, wherein the bottom portions are preferably narrower than the top portions, so that their contact areas with the underlying heaters 88 are reduced. The top portions of phase change elements 90 may be interconnected or separated, while the bottom portions are preferably separated. Top electrodes 92 are then formed, followed by the formation of metal lines 94. Preferably, metal lines 94 are formed in the bottom metallization layer (commonly referred to as M1), and extend in the column direction.

One skilled in the art will realize that the formation of the phase change elements, the heaters, and top and/or bottom electrodes may be achieved by many methods, which are also in the scope of the present invention. Also, the conductivity types of the doped semiconductor regions, such as regions 52, 54, 66, and 80 may be inversed. In other embodiments, the P+ regions 80, instead of formed by implanting a top layer of substrate 40, may be epitaxially grown on the top surface of substrate 40.

In the structure as shown in FIG. 16, N+ strips 52 may act as word-lines, while metal lines 94 may act as bit-lines. Between each of the word-lines and each of the bit-lines, a diode 84 is serially coupled to a phase change element 90 to form a phase change memory cell. Diodes 84 act as the selectors of the respective phase change memory cell.

The embodiments of the present invention have several advantageous features. Firstly, diodes 84 are formed inside silicon substrate 40 by implantations, not by epitaxial growths. The defects caused by the epitaxial growths are thus eliminated due to the fact that the p-n diodes are formed based on single-crystal substrate 40. Secondly, the memory array is highly scalable since the diodes 84 can easily be shrunk to the minimum feature size. Thirdly, since silicide regions 82$_1$ are formed between N+ strips 54 and pickup regions 66, the adverse voltage drop caused by Schottky contacts is eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a Shallow Trench Isolation (STI) region extending from a top surface of a semiconductor substrate into the semiconductor substrate;
   performing a first implantation to implant the semiconductor substrate to form a buried word-line;
   performing a second implantation to implant the semiconductor substrate to form a first and a second diode overlying and contacting the buried word-line, wherein the second diode comprises a p-type region and an n-type region forming a p-n junction; and
   performing a third implantation to convert both the p-type region and the n-type region of the second diode into a pickup region, with the p-type region and the n-type region converted to a same conductivity type, wherein the pickup region extends from the top surface of the semiconductor substrate to the buried word-line, and the first diode remains after the third implantation.

2. The method of claim 1 further comprising forming a Shallow STI (SSTI) region extending into the semiconductor substrate and contacting the first diode, wherein the SSTI region is shallower than the STI region.

3. The method of claim 2 further comprising forming a plurality of diodes in the semiconductor substrate, wherein the plurality of diodes is arranged as rows and columns, and wherein the STI region separates two rows of the plurality of diodes, and the SSTI region separates two columns of the plurality of diodes.

4. The method of claim 1, wherein the SSTI region has a bottom surface lower than a junction of the first diode, and higher than a top surface of the buried word-line.

5. The method of claim 1 further comprising:
   forming a pickup silicide region over and contacting the pickup region.

6. The method of claim 1 further comprising forming a phase change element over, and electrically coupled to, the first diode.

7. The method of claim 1, wherein during the second implantation, implanted ions penetrate through a first part of the semiconductor substrate to dope a second part of the semiconductor substrate underlying and contacting the first part to have a same conductivity type as the buried word-line, with the first part and the second part forming a p-n junction of the second diode as a result of the second implantation, and wherein a conductivity type of the first part remains un-changed by the second implantation.

8. The method of claim 1, wherein in the third implantation, both the p-type region and the n-type region are converted to have a same conductivity type as the buried word-line.

9. A method comprising:
   forming a Shallow Trench Isolation (STI) region extending from a top surface of a semiconductor substrate into the semiconductor substrate;
   performing a first implantation to implant the semiconductor substrate to form a buried word-line;
   performing a second implantation to implant the semiconductor substrate to form a first and a second diode overlying and contacting the buried word-line, wherein the second diode has a region extending to the top surface of the semiconductor substrate and having a first conductivity type opposite to a second conductivity type of the buried word-line; and
   performing a third implantation to convert the second diode into a pickup region, wherein the region of the second diode is converted to have the second conductivity type, and wherein the pickup region extends from the top surface of the semiconductor substrate to the buried word-line, and the first diode remains after the third implantation.

10. The method of claim 9 further comprising forming a Shallow STI (SSTI) region extending into the semiconductor substrate and contacting the first diode, wherein the SSTI region is shallower than the STI region.

11. The method of claim 10 further comprising forming a plurality of diodes in the semiconductor substrate, wherein the plurality of diodes is arranged as rows and columns, and wherein the STI region separates two rows of the plurality of diodes, and the SSTI region separates two columns of the plurality of diodes.

12. The method of claim 9, wherein the SSTI region has a bottom surface lower than a junction of the first diode, and higher than a top surface of the buried word-line.

13. The method of claim 9 further comprising:
forming a pickup silicide region over and contacting the pickup region.

14. The method of claim 9 further comprising forming a phase change element over, and electrically coupled to, the first diode.

15. The method of claim 9, wherein during the second implantation, implanted ions penetrate through a first part of the semiconductor substrate to dope a second part of the semiconductor substrate underlying and contacting the first part to have a same conductivity type as the buried word-line, with the first part and the second part forming a p-n junction of the second diode as a result of the second implantation, and wherein a conductivity type of the first part remains un-changed by the second implantation.

16. A method comprising:
forming a Shallow Trench Isolation (STI) region extending from a top surface of a semiconductor substrate into the semiconductor substrate;
performing a first implantation to implant the semiconductor substrate to form a buried word-line;
performing a second implantation to implant the semiconductor substrate to form a first and a second diode overlying and contacting the buried word-line; and
performing a third implantation to convert the second diode into a pickup region, wherein the third implantation converts an entirety of the second diode into a same conductivity type as the buried word-line, and wherein the pickup region extends from the top surface of the semiconductor substrate to the buried word-line, and the first diode remains after the third implantation.

17. The method of claim 16 further comprising forming a Shallow STI (SSTI) region extending into the semiconductor substrate and contacting the first diode, wherein the SSTI region is shallower than the STI region.

18. The method of claim 17 further comprising forming a plurality of diodes in the semiconductor substrate, wherein the plurality of diodes is arranged as rows and columns, and wherein the STI region separates two rows of the plurality of diodes, and the SSTI region separates two columns of the plurality of diodes.

19. The method of claim 16, wherein the SSTI region has a bottom surface lower than a junction of the first diode, and higher than a top surface of the buried word-line.

20. The method of claim 16 further comprising:
forming a pickup silicide region over and contacting the pickup region.

* * * * *